United States Patent
Lee et al.

(10) Patent No.: US 7,499,341 B2
(45) Date of Patent: Mar. 3, 2009

(54) OUTPUT CIRCUIT, SEMICONDUCTOR MEMORY DEVICE HAVING THE SAME, AND METHOD OF EXPANDING A VALID OUTPUT DATA WINDOW

(75) Inventors: Woo-Jin Lee, Seongnam-si (KR); Hyun-Dong Kim, Seoul (KR); Seong-Jin Jang, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 162 days.

(21) Appl. No.: 11/601,027

(22) Filed: Nov. 17, 2006

(65) Prior Publication Data
US 2007/0121397 A1    May 31, 2007

(30) Foreign Application Priority Data
Nov. 25, 2005    (KR) ............. 10-2005-0113327

(51) Int. Cl.
*G11C 7/10* (2006.01)
(52) U.S. Cl. .............. 365/189.05; 365/189.07; 365/189.08; 365/201; 365/233
(58) Field of Classification Search ........... 365/189.05, 365/189.07, 189.08, 201, 233
See application file for complete search history.

(56) References Cited

U.S. PATENT DOCUMENTS

| 6,400,625 | B2 * | 6/2002 | Arimoto et al. ............. 365/201 |
| 6,463,006 | B2 * | 10/2002 | Nakano et al. ......... 365/233.12 |
| 6,855,607 | B2 * | 2/2005 | Achuthan et al. ........... 438/283 |

FOREIGN PATENT DOCUMENTS

| JP | 2000-048599 | 2/2000 |
| KR | 10-2004-0082869 | 9/2004 |
| KR | 10-2004-0105060 | 12/2004 |

* cited by examiner

*Primary Examiner*—Connie C Yoha
(74) *Attorney, Agent, or Firm*—Mills & Onello LLP

(57) ABSTRACT

A semiconductor memory device and a method of expanding a valid output data window are described. The semiconductor memory device includes a memory cell array and an output circuit. The memory cell array generates read data having a plurality of bits. The output circuit outputs the read data sequentially in response to a clock signal in a normal mode. On the other hand, the output circuit selectively outputs the bits of the read data by latching bits to be tested among bits of the read data, and by electrically disconnecting bits not to be tested among bits of the read data in response to a plurality of switch control signals in a test mode. Therefore a valid data window of an output data may be expanded.

25 Claims, 9 Drawing Sheets

OUTPUT CIRCUIT, SEMICONDUCTOR MEMORY DEVICE HAVING THE SAME, AND METHOD OF EXPANDING A VALID OUTPUT DATA WINDOW

CROSS-REFERENCE TO RELATED APPLICATIONS

This application claims priority under 35 U.S.C. § 119 to Korean Patent Application No. 10-2005-0113327 filed on Nov. 25, 2005, in the Korean Intellectual Property Office, the contents of which are herein incorporated by reference in their entirety.

BACKGROUND OF THE INVENTION

1. Field of the Invention

The present invention relates to a semiconductor device, and more particularly to an output circuit, a semiconductor memory device having the same and a method of expanding a valid output data window.

2. Description of the Related Art

In order to increase a unit of data bandwidth of a semiconductor memory device, there have been efforts to increase an operating frequency of the semiconductor memory device or to output two units of data in one clock period using a technique commonly referred to as "double data rate." As the operating frequency of the semiconductor memory device becomes higher, the valid period of output data, i.e., a valid output data window, may decrease. As a result, correctly testing the semiconductor memory device becomes very difficult.

FIG. 1 is a block diagram illustrating a conventional semiconductor memory device, and FIG. 2 is a timing diagram illustrating an operation of the semiconductor memory device of FIG. 1 in a normal mode and in a test mode. The semiconductor memory device in FIG. 1 has been disclosed in a Korean Patent Laid-Open Publication No. 10-2004-0105060. In addition, a method of expanding a valid output data window by changing the frequency of the control clock is also disclosed in the Korean Patent Laid-Open Publication No. 10-2004-0105060.

Referring to FIG. 1, the semiconductor memory device includes a memory cell array 11, an output circuit 13 and a mode register set 15. In a normal mode, the output circuit 13 sequentially outputs the data RDIO_0 to RDIO_3 read from the memory cell array 11 through an output pin 17. In a test mode, the output circuit 13 changes data path to continuously output N times (N is a positive integer) the same data read from the memory cell array 11 through the output pin 17. As shown in the timing diagram in FIG. 2 where N is two, two output data DOUT are outputted in one clock cycle in response to the frequency of the clock CLK in a normal mode, and one output data DOUT are outputted in one clock cycle in response to the frequency of the clock CLK in a test mode.

The semiconductor memory device in FIG. 1 may decrease the frequency of the output data, and thus the valid output data window may be increased. The data output path, however, has to be changed in the test mode.

SUMMARY OF THE INVENTION

Example embodiments of the present invention provide a semiconductor memory device including an output circuit capable of expanding a valid data window in a test mode through the same data output path as in a normal mode.

Example embodiments of the present invention also provide an output circuit of a semiconductor memory device capable of expanding a valid data window in a test mode through the same data output path as in a normal mode.

Example embodiments of the present invention also provide a method of expanding an output data window of a semiconductor memory device in a test mode through the same data output path as in a normal mode.

According to one aspect, the present invention is directed to a semiconductor memory device including a memory cell array and an output circuit. The memory cell array generates read data having a plurality of bits. The output circuit sequentially outputs the bits of the read data in response to a clock signal in a normal mode, and selectively output the bits of the read data by latching bits to be tested among the bits of the read data and by electrically disconnecting output paths of bits not to be tested among the bits of the read data in response to a plurality of switch control signals in a test mode to expand a valid data window of an output data.

The switch control signals may be generated based on test mode register set signals applied from outside.

In one embodiment, the output circuit includes a first switching circuit, a first selecting circuit, a second switching circuit and a second selecting circuit. The first switching circuit selectively outputs the bits of the read data in response to a first switch control signal and a second switch control signal. The first selecting circuit selectively latches bits of an output of the first switching circuit to generate first selection data. The second switching circuit selectively outputs bits of the first selection data in response to a third switch control signal and a fourth switch control signal. The second selecting circuit selectively latches bits of the output data of the second switching circuit to generate second selection data.

The read data may include four bits, and the first to fourth switch control signals may be enabled in the normal mode.

In some embodiments, the test mode may include a first test mode and a second test mode. In the first test mode, a first bit and a third bit of the read data may be outputted as first output data, and in the second test mode, a second bit and a fourth bit of the read data may be outputted as second output data.

In an example embodiment, a first bit of the first output data corresponds to the first bit of the read data, a second bit of the first output data corresponds to the third bit of the read data, a first bit of the second output data corresponds to the second bit of the read data, and a second bit of the second output data corresponds to the fourth bit of the read data.

The first bit of the first output data may be generated at a rising edge of a first pulse of the clock signal and maintained for one period of the clock signal, and the second bit of the first output data may be generated at a rising edge of a second pulse of the clock signal and maintained for one period of the clock signal. Further, the first bit of the second output data may be generated at a falling edge of a first pulse of the clock signal and maintained for one period of the clock signal, and the second bit of the second output data may be generated at a falling edge of a second pulse of the clock signal and maintained for one period of the clock signal.

For example, the first switch control signal, the third switch control signal and the fourth switch control signal are enabled and the second switch control signal is disabled in the first test mode. On the other hand, the second switch control signal, the third switch control signal and the fourth switch control signal are enabled and the first switch control signal is disabled in the second test mode.

In an example embodiment, a valid output data window in the test mode is about twice wider than a valid output data window in the normal mode.

In another embodiment, the test mode may include a first test mode, a second test mode, a third test mode and a fourth test mode. A first bit of the read data is outputted as first output data in the first test mode, a third bit of the read data is outputted as second output data in the second test mode, a second bit of the read data is outputted as third output data in the third test mode, and a fourth bit of the read data is outputted as fourth output data in the fourth test mode.

The first output data corresponds to the first bit of the read data, the second output data corresponds to the third bit of the read data, the third output data corresponds to the second bit of the read data, and the fourth output data corresponds to the fourth bit of the read data.

The first output data may be generated at a rising edge of a first pulse of the clock signal and maintained for two periods of the clock signal; the second output data may be generated at a rising edge of a second pulse of the clock signal and maintained for two periods of the clock signal; the third output data may be generated at a falling edge of a first pulse of the clock signal and maintained for two periods of the clock signal; and the fourth output data may be generated at a falling edge of a second pulse of the clock signal and maintained for two periods of the clock signal.

For example, the first switch control signal and the third switch control signal are enabled, and the second switch control signal and the fourth switch control signal are disabled in the first test mode; the first switch control signal and the fourth switch control signal are enabled, and the second switch control signal and the third switch control signal are disabled in the second test mode; the second switch control signal and the third switch control signal are enabled, and the first switch control signal and the fourth switch control signal are disabled in the third test mode; and the second switch control signal and the fourth switch control signal are enabled, and the first switch control signal and the third switch control signal are disabled in the fourth test mode.

In an example embodiment, a valid output data window in the test mode is about four times wider than a valid output data window in the normal mode.

In one embodiment, the first switching circuit comprises: a first switch configured to output the first bit of the read data in response to the first switch control signal; a second switch configured to output the third bit of the read data in response to the second switch control signal; a third switch configured to output the second bit of the read data in response to the first switch control signal; and a fourth switch configured to output the fourth bit of the read data in response to the second switch control signal.

In one embodiment, the first selecting circuit comprises: a first multiplexer configured to selectively output one of the first bit and the third bit of the read data in response to the clock signal; and a second multiplexer configured to selectively output one of the second bit and the fourth bit of the read data in response to the clock signal.

In one embodiment, the second switching circuit comprises: a first switch configured to output a first bit of the first selection data in response to the third switch control signal; and a second switch configured to output a second bit of the first selection data in response to the fourth switch control signal.

In one embodiment, the second selecting circuit comprises a multiplexer configured to selectively output one of a first bit and a second bit of output data of the second switching circuit.

In one embodiment, the first switching circuit comprises: a first switch configured to output the first bit of the read data in response to the first switch control signal; a second switch configured to output the third bit of the read data in response to the second switch control signal; a third switch configured to output the second bit of the read data in response to the first switch control signal; a fourth switch configured to output the fourth bit of the read data in response to the second switch control signal; a fifth switch configured to output the first bit of the read data in response to the first switch control signal; a sixth switch configured to output the third bit of the read data in response to the second switch control signal; a seventh switch configured to output the second bit of the read data in response to the first switch control signal; and an eighth switch configured to output the fourth bit of the read data in response to the second switch control signal.

In one embodiment, the first selecting circuit comprises: a first multiplexer configured to selectively output one of the first bit and the third bit of the read data in response to the clock signal; a second multiplexer configured to selectively output one of the second bit and the fourth bit of the read data in response to the clock signal; a third multiplexer configured to selectively output one of the first bit and the third bit of the read data in response to the clock signal; and a fourth multiplexer configured to selectively output one of the second bit and the fourth bit of the read data in response to the clock signal.

In one embodiment, the second switching circuit comprises: a first switch configured to output a first bit of the first selection data in response to the third switch control signal; a second switch configured to output a second bit of the first selection data in response to the fourth switch control signal; a third switch configured to output the first bit of the first selection data in response to the third switch control signal; and a fourth switch configured to output the second bit of the first selection data in response to the fourth switch control signal.

In one embodiment, the second selecting circuit comprises: a first multiplexer configured to selectively output one of a first bit and a second bit of output data of the second switching circuit; and a second multiplexer configured to selectively output one of the first bit and the second bit of the output data of the second switching circuit.

In one embodiment, the device further comprises an output driving circuit configured to buffer the second selection data to generate the output data.

According to another aspect, the present invention is directed to an output circuit of a semiconductor memory device. The output circuit includes a first switching circuit configured to selectively output bits of read data in response to a first switch control signal and a second switch control signal; a first selecting circuit configured to selectively latch bits of an output of the first switching circuit to generate first selection data; a second switching circuit configured to selectively output bits of the first selection data in response to a third switch control signal and a fourth switch control signal; and a second selecting circuit configured to selectively latch bits of an output of the second switching circuit to generate second selection data.

In one embodiment, the output circuit further comprises an output driving circuit configured to buffer the second selection data to generate output data.

According to a third aspect the present invention is directed to a method of expanding an output data window of a semiconductor memory device. The method includes sequentially outputting bits of read data in response to a clock signal in a normal mode; selectively latching bits to be tested among bits of the read data in response to a plurality of switch control signals in a test mode; and electrically disconnecting output paths of bits not to be tested among bits of the read data in response to the plurality of switch control signals in the test mode to expand a valid data window of output data.

According to the invention, a valid data window in a test mode may be expanded through the same data output path as in a normal mode.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE PREFERRED EMBODIMENTS

Figure 1:
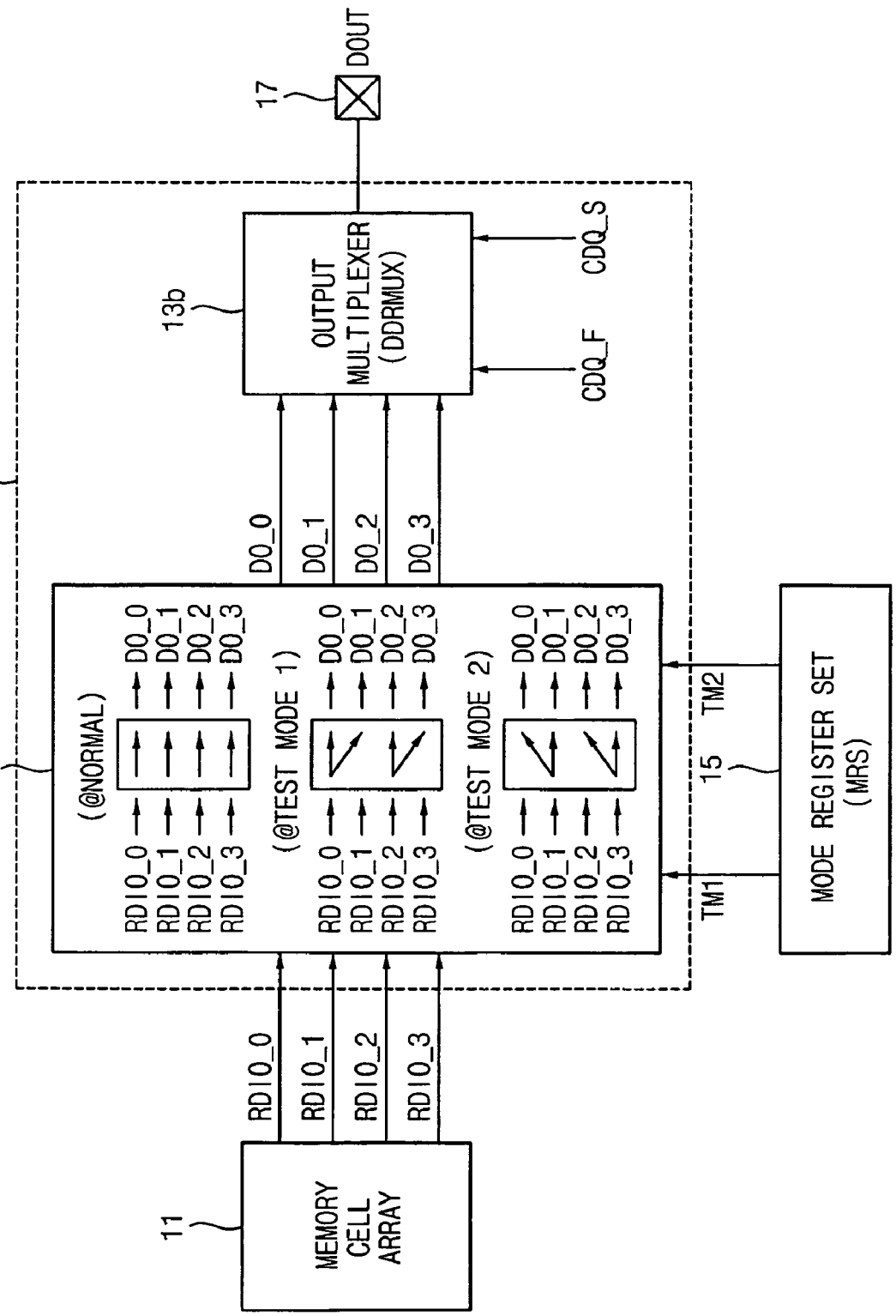
FIG. 1 is a block diagram illustrating a conventional semiconductor memory device.
Figure 2:
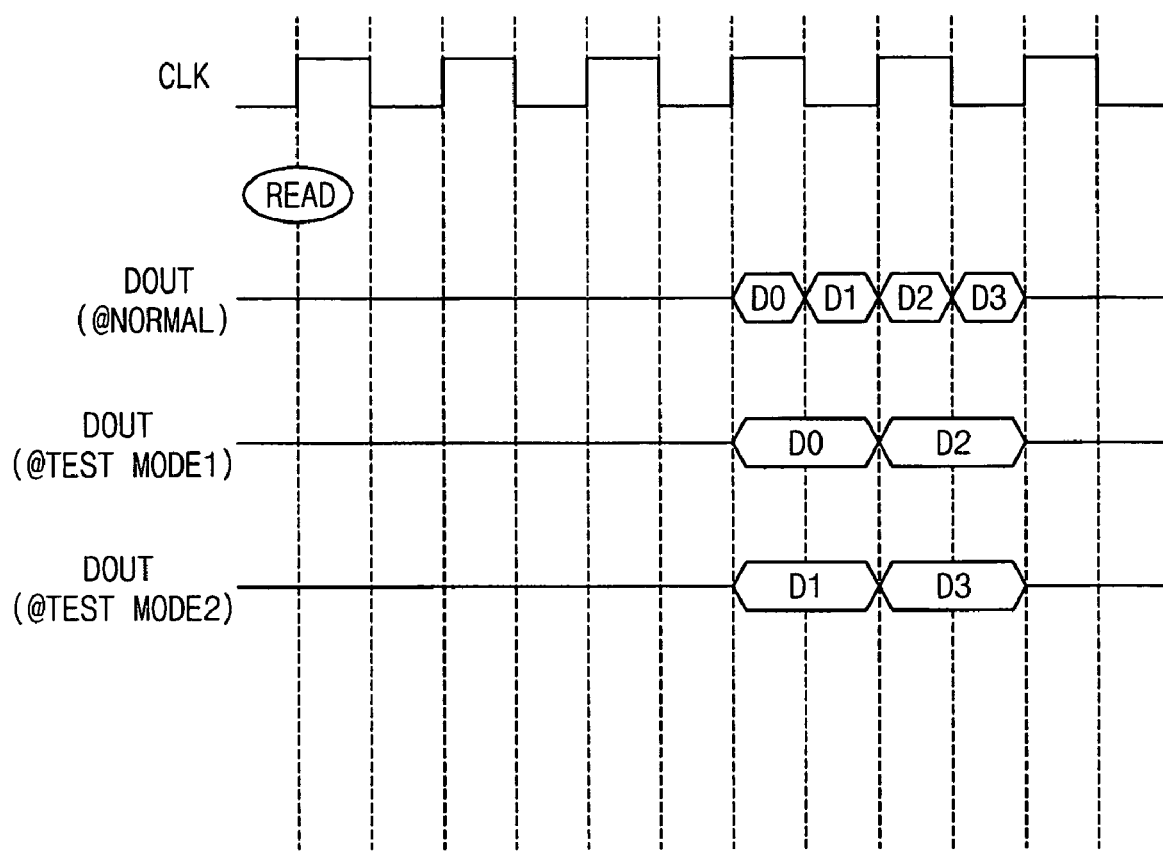
FIG. 2 is a timing diagram illustrating an operation of the semiconductor memory device in FIG. 1 in a normal mode and in a test mode.

Example embodiments of the present invention are described herein. However, specific structural and functional details disclosed herein are merely representative for purposes of describing example embodiments of the present invention. Thus, example embodiments of the present invention may be embodied in many alternate forms and should not be construed as limited to example embodiments of the present invention set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relation between elements should be interpreted in a like fashion (i.e., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
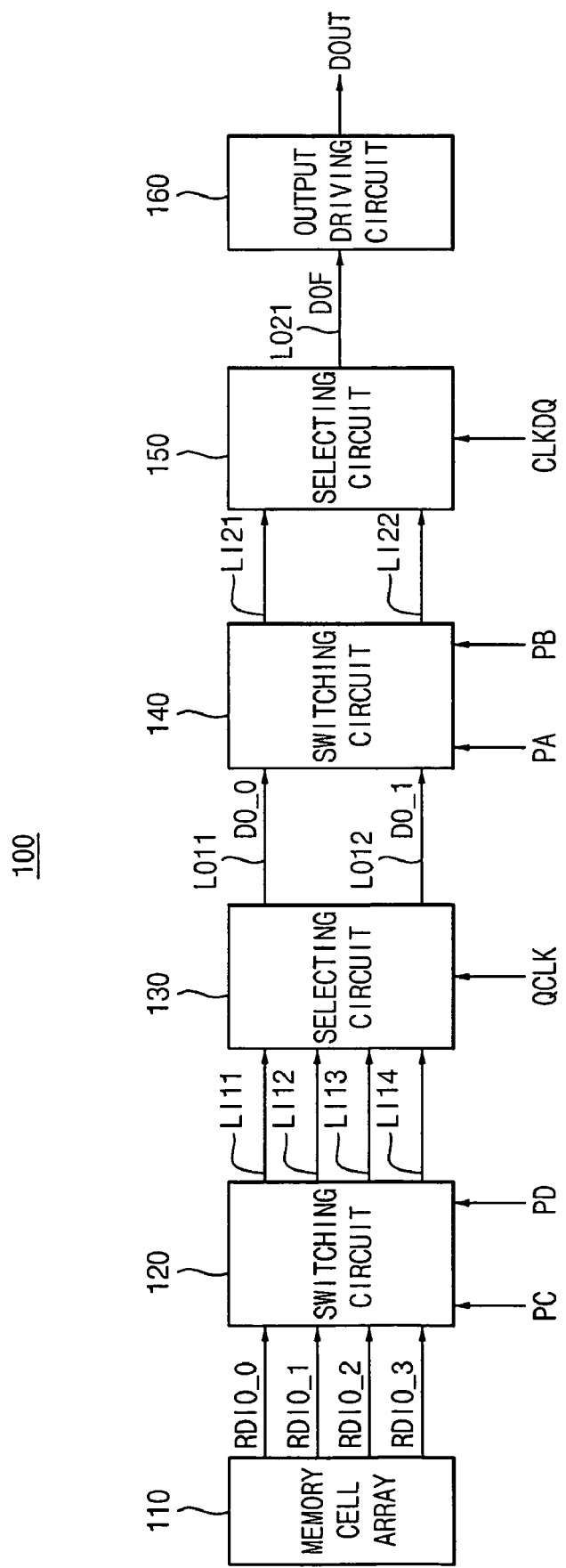
FIG. 3 is a circuit diagram illustrating a semiconductor memory device according to an example embodiment of the present invention.

FIG. 3 is a circuit diagram illustrating a semiconductor memory device according to an example embodiment of the present invention.

Referring to FIG. 3, the semiconductor memory device 100 includes a memory cell array 110, a first switching circuit 120, a first selecting circuit 130, a second switching circuit 140, a second selecting circuit 150 and an output driving circuit 160.

The memory cell array 110 outputs read data RDIO_0, RDIO_1, RDIO_2 and RDIO_3.

The first switching circuit 120 receives read data RDIO_0, RDIO_1, RDIO_2 and RDIO_3, and outputs the read data RDIO_0, RDIO_1, RDIO_2 and RDIO_3 to input terminals LI11 to LI14 of the first selecting circuit 130 in response to switch control signals PC and PD.

The first selecting circuit 130 selects data bits of input terminals LI11 to LI14 of the first selecting circuit 130 and outputs the selected data bits (for example, two data bits DO_0 and DO_1) to output terminals LO11 to LO12 in response to a clock signal QCLK.

The second switching circuit 140 outputs the data bits DO_0 and DO_1 of the output terminals LO11 and LO12 of the first selecting circuit 130 to input terminals LI21 and LI22 of the second selecting circuit 150 in response to switch control signals PA and PB.

The second selecting circuit 150 selects data bits of the input terminals LI21 and LI22 of the second selecting circuit 150 and outputs the selected data bits as selection data DOF to an output terminal LO21 of the second selecting circuit 150 in response to a clock signal CLKDQ.

The output driving circuit 160 buffers the selection data DOF of the second selecting circuit 150 to generate output data DOUT.

Figure 4:
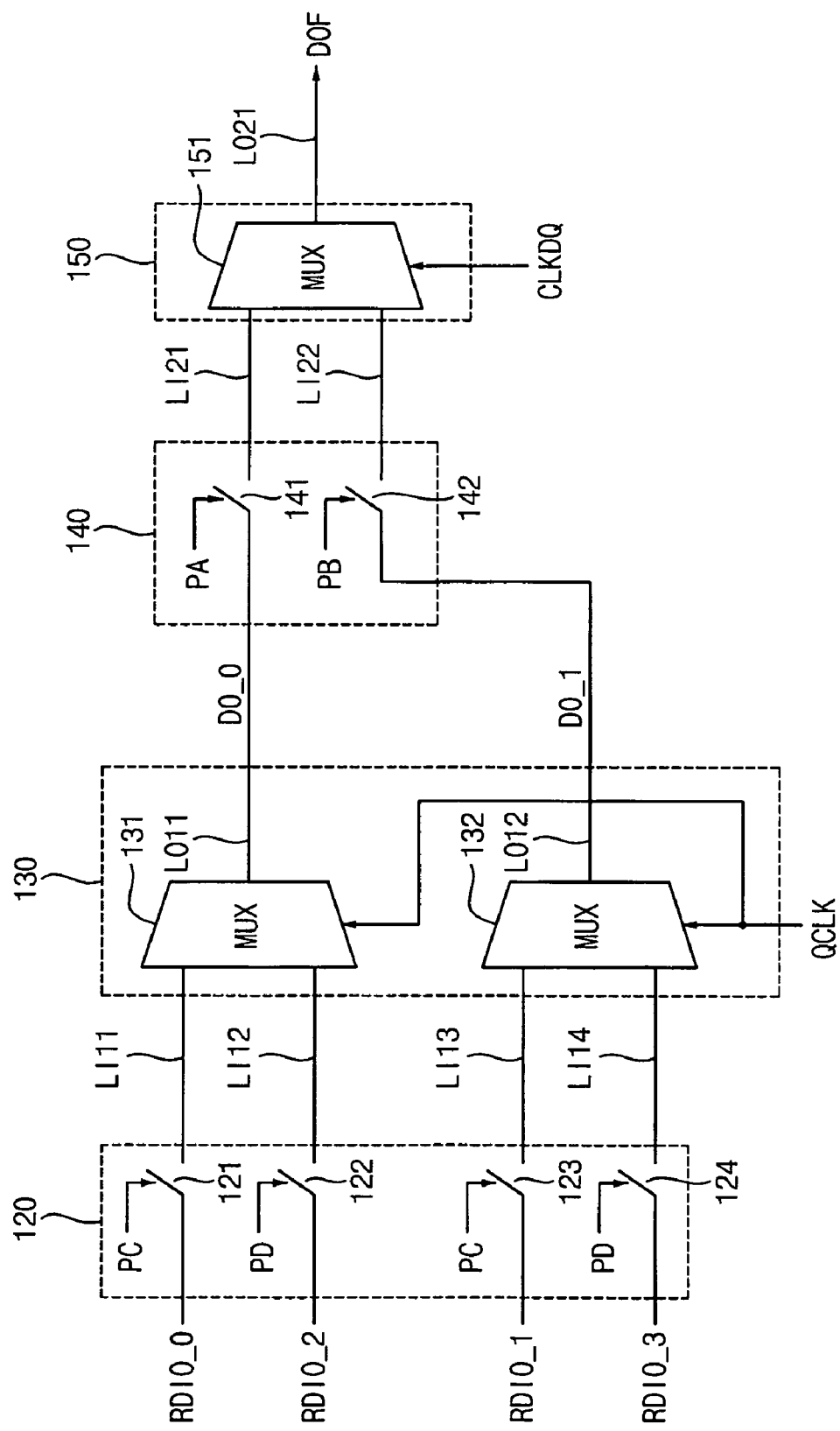
FIG. 4 is a circuit diagram illustrating switching circuits and selecting circuits included in the semiconductor memory device in FIG. 3.

FIG. 4 is a circuit diagram illustrating example embodiments of switching circuits and selecting circuits included in the semiconductor memory device in FIG. 3.

Referring to FIG. 4, the first switching circuit 120 includes switches 121, 122, 123 and 124, and the second switching circuit 140 includes switches 141 and 142. The first selecting circuit 130 includes multiplexers 131 and 132, and the second selecting circuit 150 includes a multiplexer 151.

The switch 121 outputs a bit RDIO_0 of the read data to the input terminal LI11 of the first selecting circuit 130 in response to a switch control signal PC. The switch 122 outputs a bit RDIO_2 of the read data to the input terminal LI12 of the first selecting circuit 130 in response to a switch control signal PD. The switch 123 outputs a bit RDIO_1 of the read data to the input terminal LI13 of the first selecting circuit 130 in response to the switch control signal PC. The switch 124 outputs a bit RDIO_3 of the read data to the input terminal LI14 of the first selecting circuit 130 in response to the switch control signal PD.

The multiplexer 131 selects one of data bits of the input terminals LI11 and LI12 of the first selecting circuit 130 and outputs the selected data bit DO_0 to an output terminal LO11 of the first selecting circuit 130 in response to a clock signal QCLK. The multiplexer 132 selects one of data bits of the input terminals LI13 and LI14 of the first selecting circuit 130 and outputs the selected data bit DO_1 to an output terminal LO12 of the first selecting circuit 130 in response to the clock signal QCLK.

The switch 141 outputs a data bit DO_0 of the output terminal LO11 of the first selecting circuit 130 to an input terminal LI21 of the second selecting circuit 150 in response to a switch control signal PA. The switch 142 outputs a data bit DO_1 of the output terminal LO12 of the first selecting circuit 130 to an input terminal LI22 of the second selecting circuit 150 in response to a switch control signal PB.

The multiplexer 151 selects one of data bits of the input terminals LI21 and LI22 of the second selecting circuit 150 and outputs the selected data bit as selection data DOF to an output terminal LO21 of the second selecting circuit 150 in response to an output clock signal CLKDQ.

Figure 5:
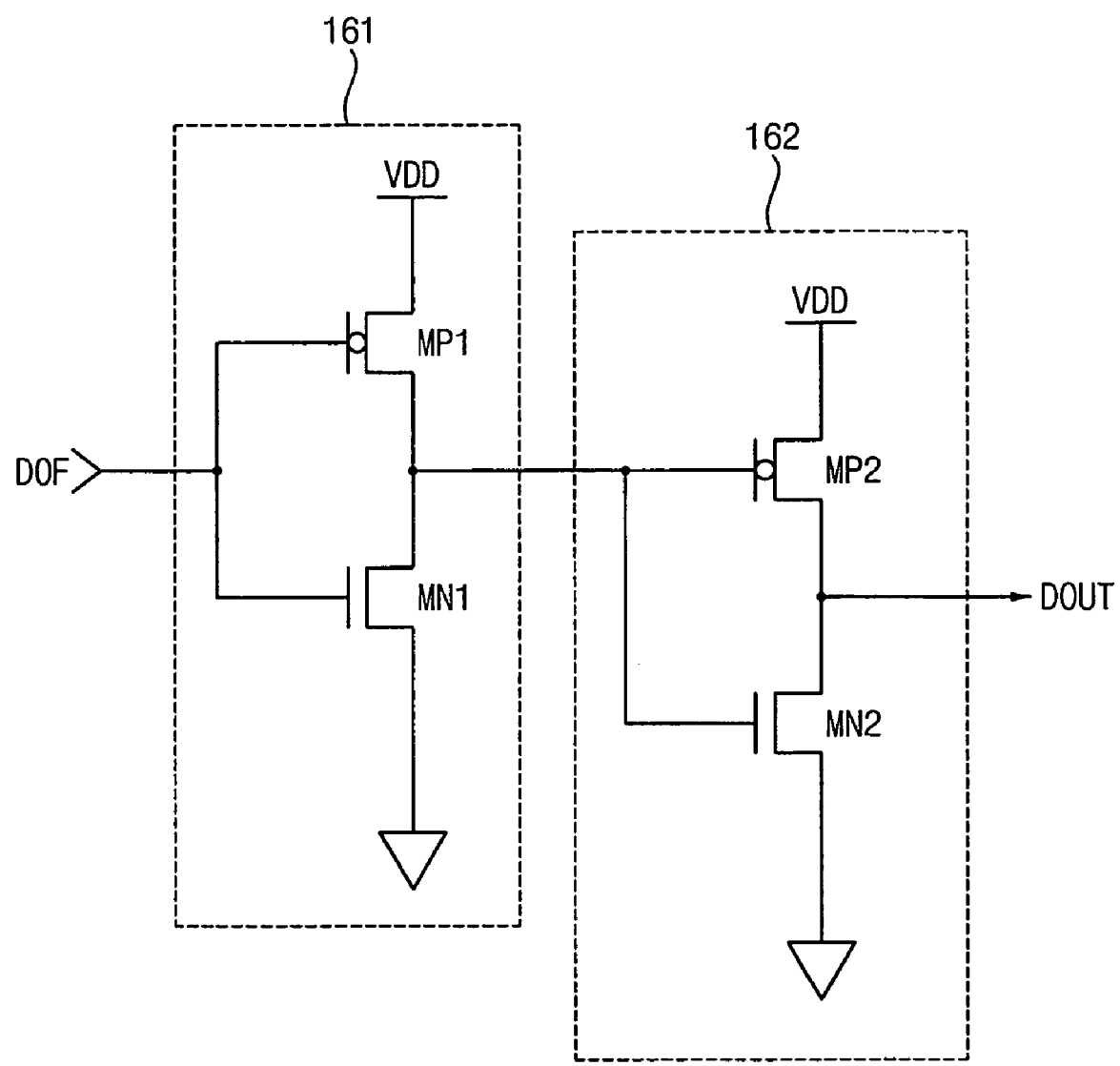
FIG. 5 is a circuit diagram illustrating an example embodiment of an output driving circuit included in the semiconductor memory device in FIG. 3.

FIG. 5 is a circuit diagram illustrating an example embodiment of an output driving circuit included in the semiconductor memory device in FIG. 3.

Referring to FIG. 5, the output driving circuit 160 includes inverters 161 and 162 that are connected in cascade. The inverter 161 inverts and buffers the output signal DOF of the second selecting circuit 150 in FIG. 3. The inverter 162 inverts and buffers the output signal of the inverter 161.

Hereinafter, the operation of the semiconductor memory device, according to an example embodiment of the present invention, will be described referring to FIGS. 3, 4 and 5. The switch control signals PA, PB, PC and PD may be generated as illustrated in FIG. 9 based on test mode register set signals.

Referring to FIG. 4, in the output circuit of the semiconductor memory device, data bits to be tested among bits RDIO_0, RDIO_1, RDIO_2 and RDIO_3 of the read data are outputted as a selection data DOF sequentially through the first switching circuit 120, the first selecting circuit 130, the second switching circuit 140 and the second selecting circuit 150.

Figure 9:
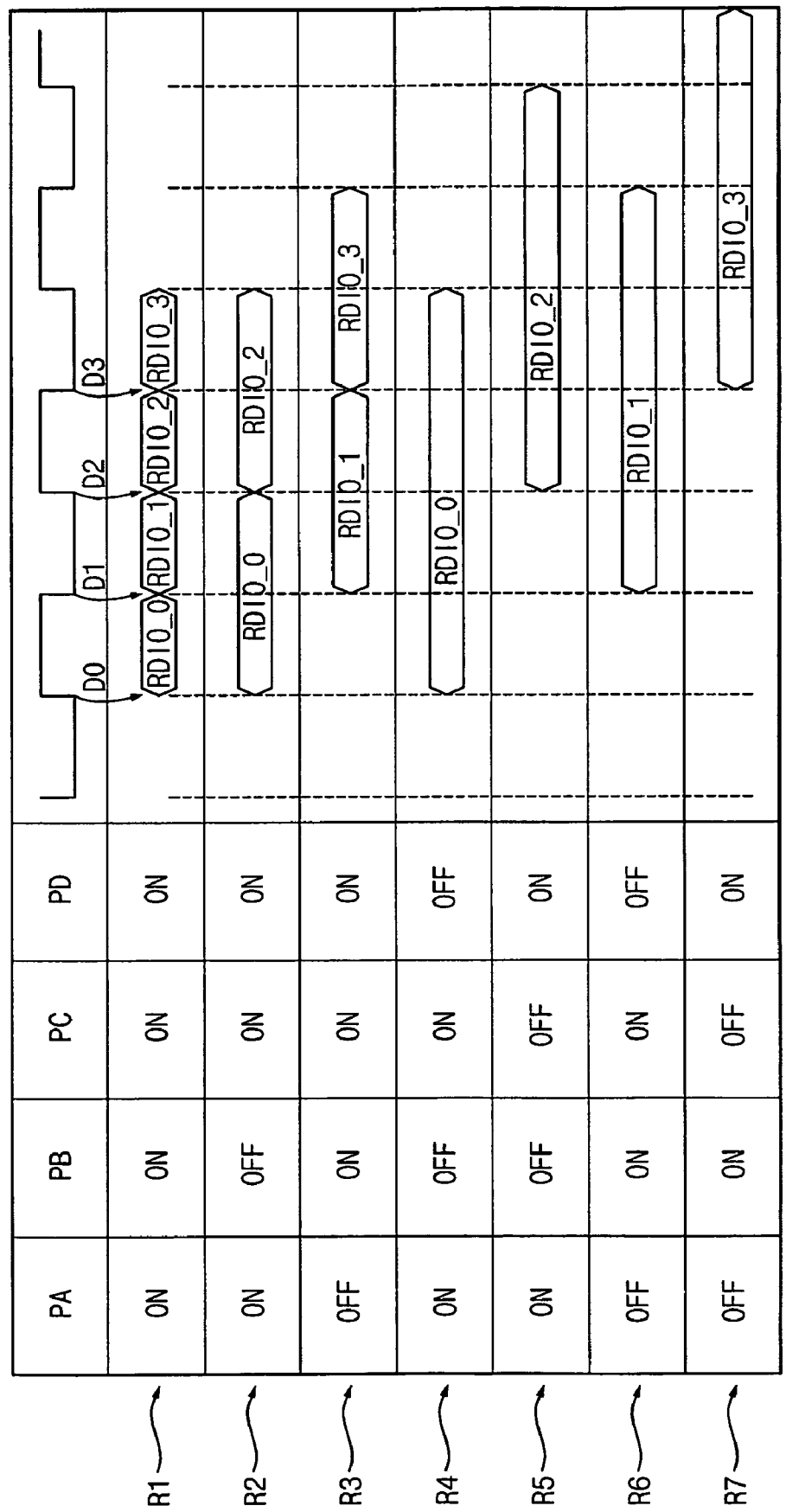
FIG. 9 is a timing diagram illustrating output data of the semiconductor memory devices in FIG. 3 and FIG. 6 according to the state of switch control signals.

Referring to FIG. 4 and FIG. 9, the switch control signals PA, PB, PC and PD have logic "high" in a normal mode, and all the switches 121 to 124, 141 and 142, which are included in the first switching circuit 120 and the second switching circuit 140, are turned on. In a normal mode, each of the bits RDIO_0, RDIO_1, RDIO_2 and RDIO_3 of the read data are sequentially outputted as the selection data DOF (that is, one bit by one bit at a time) in response to the output clock signal CLKDQ. The selection data DOF is buffered by the output driving circuit 160 in FIG. 3 and outputted as the output data DOUT. As shown in FIG. 9, bits RDIO_0, RDIO_1, RDIO_2 and RDIO_3 are outputted in the order of RDIO_0, RDIO_2, RDIO_1 and RDIO_3 in a normal mode.

The test mode may include a first test mode and a second test mode. In the first test mode, the first bit RDIO_0 and the third bit RDIO_2 are outputted as the output data DOUT. In the second test mode, the second bit RDIO_1 and the fourth bit RDIO_3 are outputted as the output data DOUT.

The semiconductor memory device in FIG. 3 includes the switching circuits 120 and 140 and the selecting circuits 130 and 150 so that a valid data window of the output data DOUT may be expanded in a test mode in response to the switch control signals PA, PB, PC and PD. In FIG. 9, the relationship between logic states of the switch control signals PA, PB, PC and PD and the output data DOUT is illustrated for the cases that the valid data window of the output data DOUT in a test mode is about two and about four times wider than the valid data window of the output data DOUT in a normal mode.

The detailed operation of the output circuit of the semiconductor memory device 100 according to the logic states of the switch control signals PA, PB, PC and PD will be described in more detail below with reference to FIG. 9.

Figure 6:
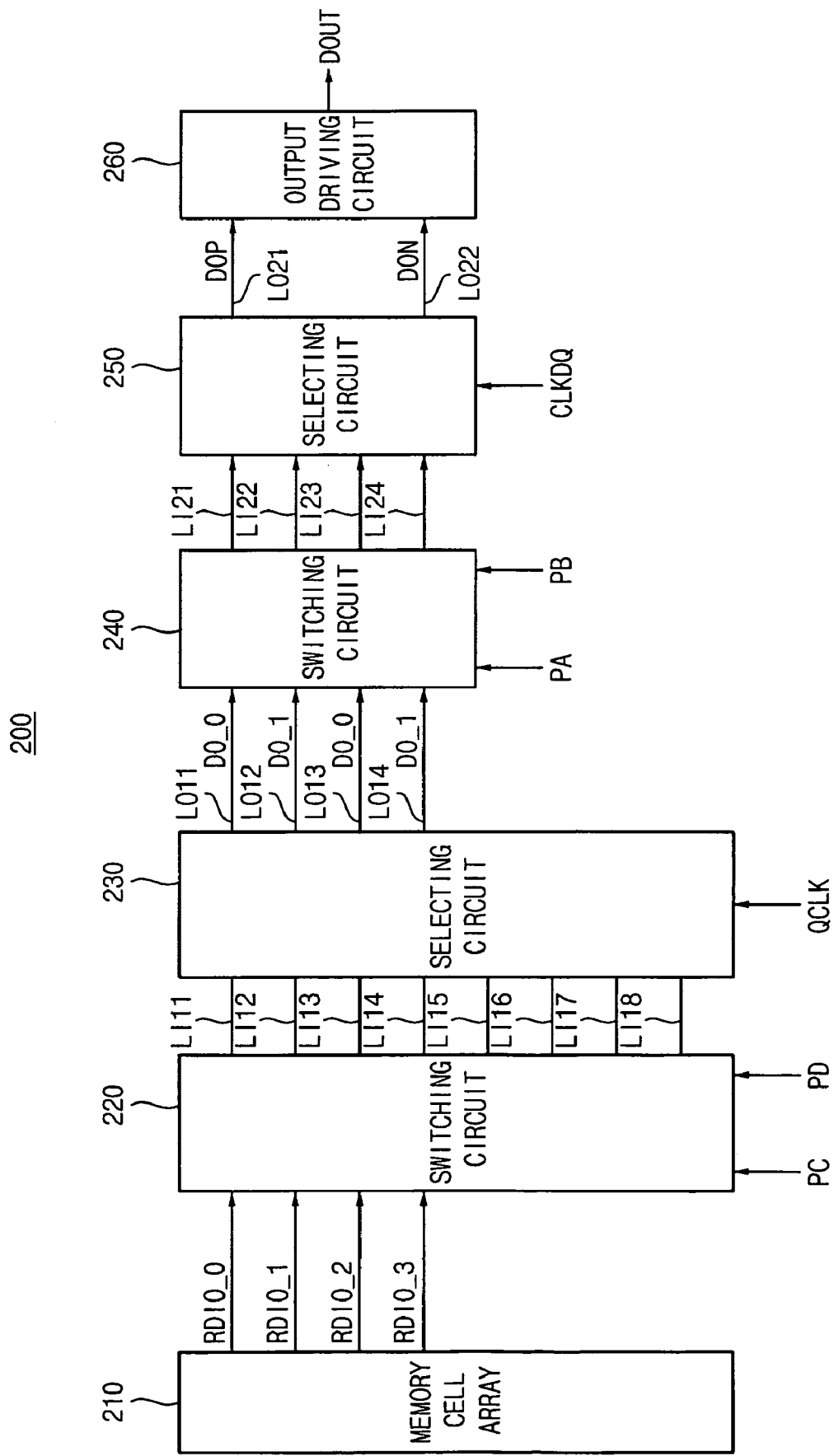
FIG. 6 is a circuit diagram illustrating a semiconductor memory device according to another example embodiment of the present invention.

FIG. 6 is a circuit diagram illustrating a semiconductor memory device according to another example embodiment of the present invention.

Referring to FIG. 6, the semiconductor memory device 200 includes a memory cell array 210, a first switching circuit 220, a first selecting circuit 230, a second switching circuit 240, a second selecting circuit 250 and an output driving circuit 260.

The memory cell array 210 outputs read data RDIO_0, RDIO_1, RDIO_2 and RDIO_3.

The first switching circuit 220 receives read data RDIO_0, RDIO_1, RDIO_2 and RDIO_3 , and outputs the read data RDIO_0, RDIO_1, RDIO_2 and RDIO_3 to input terminals LI11 to LI18 of the first selecting circuit 230 in response to switch control signals PC and PD.

The first selecting circuit 230 selects data bits of input terminals LI11 to LI18 of the first selecting circuit 230 and outputs the selected data bits to output terminals LO11 to LO14 in response to a clock signal QCLK.

The second switching circuit 240 outputs the selected data bits DO_0 and DO_1 of the output terminals LO11, LO12, LO13 and LO14 of the first selecting circuit 230 to input terminals LI21, LI22, LI23 and LI24 of the second selecting circuit 250 in response to switch control signals PA and PB.

The second selecting circuit 250 selects data bits of the input terminals LI21 to LI24 of the second selecting circuit 250 and outputs the selected data bits as the selection data DOP and DON to output terminals LO21 and LO22 of the second selecting circuit 250 in response to a clock signal CLKDQ.

The output driving circuit 260 buffers the selection data DOP and DON of the second selecting circuit 250 to generate output data DOUT.

Figure 7:
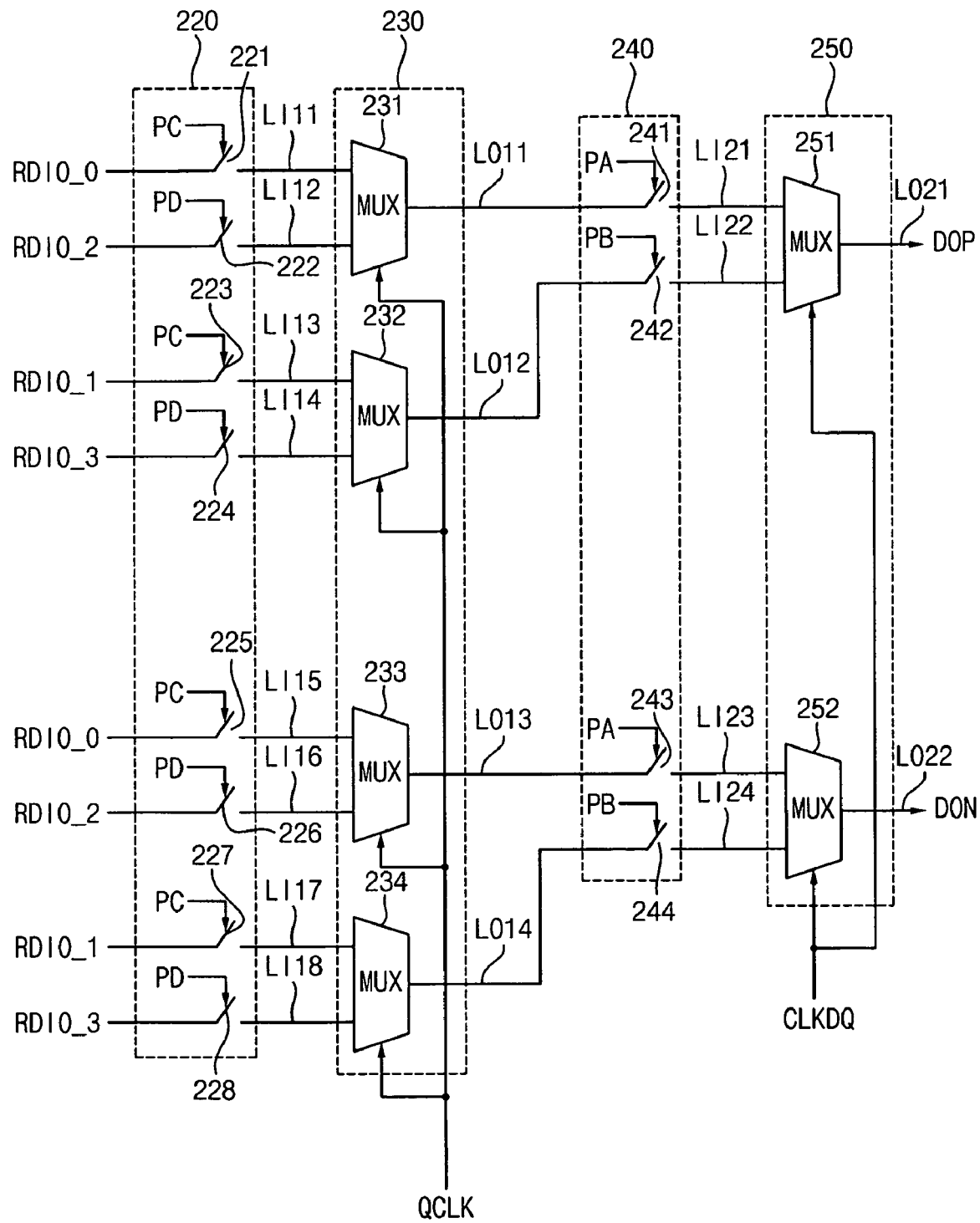
FIG. 7 is a circuit diagram illustrating switching circuits and selecting circuits included in the semiconductor memory device in FIG. 6.

FIG. 7 is a circuit diagram illustrating example embodiments of switching circuits 220 and 240 and selecting circuits 230 and 250 included in the semiconductor memory device in FIG. 6.

Referring to FIG. 7, the first switching circuit 220 includes switches 221 to 228, and the second switching circuit 240 includes switches 241 to 244. The first selecting circuit 230 includes multiplexers 231 to 234, and the second selecting circuit 250 includes multiplexers 251 and 252.

The switch 221 outputs a bit RDIO_0 of the read data to the input terminal LI11 of the first selecting circuit 230 in response to a switch control signal PC. The switch 222 outputs a bit RDIO_2 of the read data to the input terminal LI12 of the first selecting circuit 230 in response to a switch control signal PD. The switch 223 outputs a bit RDIO_1 of the read data to the input terminal LI13 of the first selecting circuit 230 in response to the switch control signal PC. The switch 224 outputs a bit RDIO_3 of the read data to the input terminal LI14 of the first selecting circuit 230 in response to the switch control signal PD. The switch 225 outputs a bit RDIO_0 of the read data to the input terminal LI15 of the first selecting circuit 230 in response to the switch control signal PC. The switch 226 outputs a bit RDIO_2 of the read data to the input terminal LI16 of the first selecting circuit 230 in response to the switch control signal PD.

The switch 227 outputs a bit RDIO_1 of the read data to the input terminal LI17 of the first selecting circuit 230 in response to the switch control signal PC. The switch 228 outputs a bit RDIO_3 of the read data to the input terminal LI18 of the first selecting circuit 230 in response to the switch control signal PD.

The multiplexer 231 selects one of data bits of the input terminals LI11 and LI12 of the first selecting circuit 230 and outputs the selected data bit to an output terminal LO11 of the first selecting circuit 230 in response to a clock signal QCLK. The multiplexer 232 selects one of data bits of the input terminals LI13 and LI14 of the first selecting circuit 230 and outputs the selected data bit to an output terminal LO12 of the first selecting circuit 230 in response to the clock signal QCLK. The multiplexer 233 selects one of data bits of the input terminals LI15 and LI16 of the first selecting circuit 230 and outputs the selected data bit to an output terminal LO13 of the first selecting circuit 230 in response to the clock signal QCLK. The multiplexer 234 selects one of data bits of the input terminals LI17 and LI18 of the first selecting circuit 230 and outputs the selected data bit to an output terminal LO14 of the first selecting circuit 230 in response to the clock signal QCLK.

The switch 241 outputs a data bit of the output terminal LO11 of the first selecting circuit 230 to an input terminal LI21 of the second selecting circuit 250 in response to a switch control signal PA. The switch 242 outputs a data bit of the output terminal LO12 of the first selecting circuit 230 to an input terminal LI22 of the second selecting circuit 250 in response to a switch control signal PB. The switch 243 outputs a data bit of the output terminal LO13 of the first selecting circuit 230 to an input terminal LI23 of the second selecting circuit 250 in response to the switch control signal PA. The switch 244 outputs a data bit of the output terminal LO14 of the first selecting circuit 230 to an input terminal LI24 of the second selecting circuit 250 in response to the switch control signal PB.

The multiplexer 251 selects one of data bits of the input terminals LI21 and LI22 of the second selecting circuit 250 and outputs the selected data bit to an output terminal LO21 of the second selecting circuit 250 in response to an output clock signal CLKDQ. The multiplexer 252 selects one of data bits of the input terminals LI23 and LI24 of the second selecting circuit 250 and outputs the selected data bit to an output terminal LO22 of the second selecting circuit 250 in response to the output clock signal CLKDQ.

Figure 8:
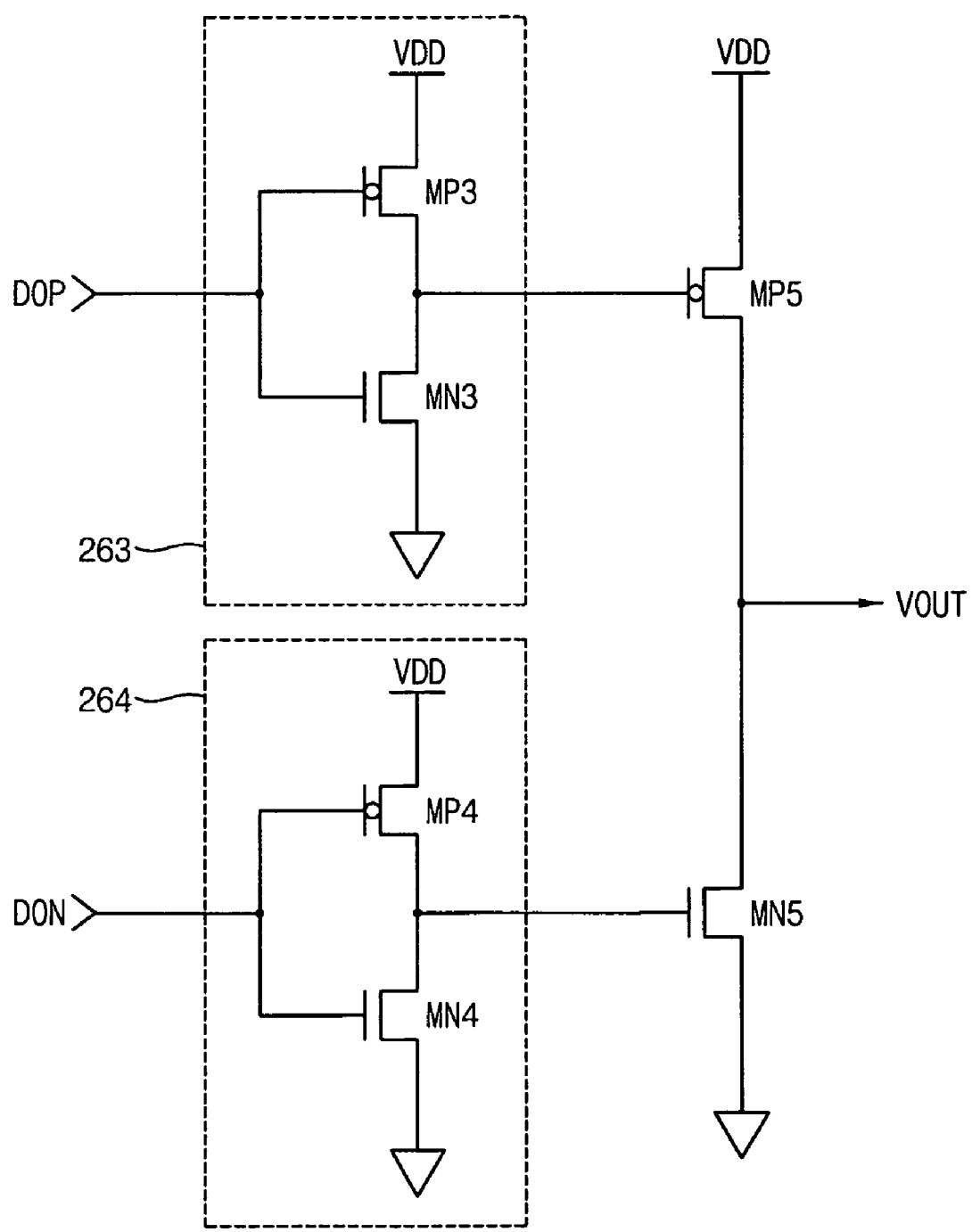
FIG. 8 is a circuit diagram illustrating an example embodiment of an output driving circuit included in the semiconductor memory device in FIG. 6.

FIG. 8 is a circuit diagram illustrating an example embodiment of an output driving circuit included in the semiconductor memory device in FIG. 6.

Referring to FIG. 8, the output driving circuit 260 includes inverters 263 and 264, a PMOS transistor MP5 and an NMOS transistor MN5. The inverter 263 inverts selection data DOP of the second selecting circuit 250 in FIG. 6, and the inverter 264 inverts selection data DON of the second selecting circuit 250 in FIG. 6. The inverter 263 may include a PMOS transistor MP3 and an NMOS transistor MN3, and the inverter 264 may include a PMOS transistor MP4 and an NMOS transistor MN4. The PMOS transistor MP5 electrically connects an output node to a supply voltage VDD in response to an output signal of the inverter 263. The NMOS transistor MN5 electrically connects an output node to a ground voltage in response to an output signal of the inverter 264.

Hereinafter, the operation of the semiconductor memory device according to another example embodiment of the present invention will be described referring to FIGS. 6, 7 and 8.

The semiconductor memory device in FIG. 6 generates the two selection data DOP and DON to drive the output driving circuit 260.

Therefore, an output data of the first switching circuit 220 has eight bits. The read data bits RDIO_0 to RDIO_3 that are inputted to the switches 221 to 224 are the same as the read data bits RDIO_0 to RDIO_3 that are inputted to the switches 225 to 228. In FIG. 7, the upper part structure of the circuit is the same as the lower part structure of the circuit. That is, the output circuit in FIG. 7 includes two of the output circuits in FIG. 4, and generates the two selection data DOP and DON that have the same logic value with each other.

As the operation of the circuits in FIG. 6 and FIG. 7 is similar to the operation of the circuits in FIG. 3 and FIG. 4, respectively, the repeated description will be omitted.

FIG. 9 is a timing diagram illustrating output data of the semiconductor memory devices in FIG. 3 and FIG. 6 according to the state of switch control signals.

In FIG. 9, PA, PB, PC and PD in the first row denote switch control signals that control the switching circuits 120 and 140 included in the semiconductor memory device as shown in FIG. 4 or control the switching circuits 220 and 240 included in the semiconductor memory device as shown in FIG. 7. The pulse signal in the first row denotes the output clock signal CLKDQ. The bits D0, D1, D2 and D3 denote bits of the output data DOUT. In FIG. 9, "ON" represents that a corresponding switch is turned on, and "OFF" represents that a corresponding switch is turned off.

Referring to FIG. 9, the second row R1 represents example states of the switches corresponding to PA, PB, PC, and PD and waveforms of output data in a normal mode.

In the normal mode, switches in the switching circuits 120, 140, 220 and 240 are all turned on. Four read data bits RDIO_0, RDIO_1, RDIO_2 and RDIO_3 are outputted as output data DOUT during two clock periods. The output data DOUT is outputted at a rising edge and a falling edge of the output clock signal CLKDQ in the normal mode.

The third row R2 and the fourth row R3 represent combinations of the switch control signals PA, PB, PC and PD when the valid output data window in the test mode is twice wider than the valid output data window in the normal mode. Here, the test mode may include a first test mode in which a first bit RDIO_0 and a third bit RDIO_2 of the read data bits RDIO_0, RDIO_1, RDIO_2 and RDIO_3 are outputted as the output data DOUT, and a second test mode in which a second bit RDIO_1 and a fourth bit RDIO_3 of the read data bits RDIO_0, RDIO_1, RDIO_2 and RDIO_3 are outputted as the output data DOUT.

The fifth row R4 to the eighth row R7 represent combinations of the switch control signals PA, PB, PC and PD when the valid output data window in the test mode is four times wider than the valid output data window in the normal mode.

Here, the test mode may include a first test mode, a second test mode, a third test mode and a fourth test mode. In the first test mode, a first bit RDIO_0 of the read data bits RDIO_0, RDIO_1, RDIO_2 and RDIO_3 is outputted as the output data DOUT. In the second test mode, a third bit RDIO_2 of the read data bits RDIO_0, RDIO_1, RDIO_2 and RDIO_3 is outputted as the output data DOUT. In the third test mode, a second bit RDIO_1 of the read data bits RDIO_0, RDIO_1, RDIO_2 and RDIO_3 is outputted as the output data DOUT. In the fourth test mode, a fourth bit RDIO_3 of the read data bits RDIO_0, RDIO_1, RDIO_2 and RDIO_3 is outputted as the output data DOUT.

The third row R2 represents a waveform of the output data DOUT when PA is logic "high (that is, "ON")," PB is logic "low (that is, "OFF")," PC is logic "high" and PD is logic "high." In this condition, switches to which PB is applied are turned off and switches to which PA, PC or PD is applied are turned on. Accordingly, a read data bit RDIO_0 is generated at the front edge of a first pulse of the output clock signal CLKDQ and is maintained for one period of the output clock signal CLKDQ. Further, a read data bit RDIO_2 is generated at the front edge of a second pulse of the output clock signal CLKDQ, and is maintained for one period of the output clock signal CLKDQ. For example, an odd data bit RDIO_0 of the read data bits RDIO_0, RDIO_1, RDIO_2 and RDIO_3 is outputted in one period of the output clock signal CLKDQ, and an odd data bit RDIO_2 of the read data bits RDIO_0, RDIO_1, RDIO_2 and RDIO_3 is outputted in the next one period of the output clock signal CLKDQ.

The fourth row R3 represents a waveform of the output data DOUT when PA is logic "low," PB is logic "high," PC is logic "high" and PD is logic "high." In this condition, switches to which PA is applied are turned off and switches to which PB, PC or PD is applied are turned on. Accordingly, a read data bit RDIO_1 is generated at the back edge of the first pulse of the output clock signal CLKDQ, and is maintained for one period of the output clock signal CLKDQ. Further, a read data bit RDIO_3 is generated at the back edge of the second pulse of the output clock signal CLKDQ, and is maintained for one period of the output clock signal CLKDQ. For example, an even data bit RDIO_1 of the read data bits RDIO_0, RDIO_1, RDIO_2 and RDIO_3 is outputted in one period of the output clock signal CLKDQ, and an even data bit RDIO_3 of the read data bits RDIO_0, RDIO_1, RDIO_2 and RDIO_3 is outputted in the next one period of the output clock signal CLKDQ.

According to a combination of the switch control signals PA, PB, PC and PD that are shown in the third row R2 and fourth row R3 in FIG. 9, four bits RDIO_0, RDIO_1, RDIO_2 and RDIO_3 of the read data are outputted as output data for 2.5 clock periods of the output clock signal CLKDQ. By a combination of the switch control signals PA, PB, PC and PD shown in the third row R2 and in the fourth row R3, the valid output data window in the test mode becomes twice wider than the valid output data window that is formed by using a combination of the switch control signals PA, PB, PC and PD shown in the second row R1 of the normal mode.

The fifth row R4 represents a waveform of the output data DOUT when PA is logic "high," PB is logic "low," PC is logic "high" and PD is logic "low." In this condition, switches to which PB or PD is applied are turned off and switches to which PA or PC is applied are turned on. Accordingly, a read data bit RDIO_0 of the read data bits RDIO_0, RDIO_1, RDIO_2 and RDIO_3 is generated at the front edge of a first pulse of the output clock signal CLKDQ, and is maintained for two periods of the output clock signal CLKDQ.

The sixth row R5 represents a waveform of the output data DOUT when PA is logic "high," PB is logic "low," PC is logic "low" and PD is logic "high." In this condition, switches to which PA or PD is applied are turned on and switches to which PB or PC is applied are turned off. Accordingly, a read data bit RDIO_2 of the read data bits RDIO_0, RDIO_1, RDIO_2 and RDIO_3 is generated at the front edge of a second pulse of the output clock signal CLKDQ, and is maintained for two periods of the output clock signal CLKDQ.

The seventh row R6 represents a waveform of the output data DOUT when PA is logic "low," PB is logic "high," PC is logic "high" and PD is logic "low." In this condition, switches to which PB or PC is applied are turned on and switches to which PA or PD is applied are turned off. Accordingly, a read data bit RDIO_1 of the read data bits RDIO_0, RDIO_1, RDIO_2 and RDIO_3 is generated at the back edge of a first pulse of the output clock signal CLKDQ, and is maintained for two periods of the output clock signal CLKDQ.

The eighth row R7 represents a waveform of the output data DOUT when PA is logic "low," PB is logic "high," PC is logic "low" and PD is logic "high." In this condition, switches to which PB or PD is applied are turned on and switches to which PA or PC is applied are turned off. Accordingly, a read data bit RDIO_3 of the read data bits RDIO_0, RDIO_1, RDIO_2 and RDIO_3 is generated at the back edge of a second pulse of the output clock signal CLKDQ, and is maintained for two periods of the output clock signal CLKDQ.

According to a combination of the switch control signals PA, PB, PC and PD that are shown in the fifth row R4 to eighth row R7 in FIG. 9, four bits RDIO_0, RDIO_1, RDIO_2 and RDIO_3 of the read data are outputted as output data for 3.5 clock periods of the output clock signal CLKDQ. By a combination of the switch control signals PA, PB, PC and PD shown in the fifth row R4 and in eighth row R7, the valid output data window in the test mode becomes four times wider than the valid output data window that is formed by using a combination of the switch control signals PA, PB, PC and PD shown in the second row R1 in the normal mode.

The semiconductor memory device having the output circuits, according to example embodiments of the present invention, may expand a valid output data window in the test mode. In FIG. 9, the case that the valid data window in the test mode is two or four times wider than the valid data window in the normal mode is described. However, the semiconductor memory device according to the present invention may expand the valid data window in the test mode so that the valid data window in the test mode is arbitrary times wider than the valid data window in the normal mode.

As described above, the semiconductor memory device according to the present invention includes an output circuit having switching circuits and selecting circuits, and selects and latches the bits to be tested of the read data bits and electrically disconnects the path of the bits not to be tested of the read data bits. Accordingly, the valid data window of the output data may be expanded.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:
1. A semiconductor memory device, comprising:
a memory cell array configured to generate read data having a plurality of bits; and
an output circuit configured to sequentially output the bits of the read data in response to a clock signal in a normal mode, and configured to selectively output the bits of the read data by latching bits to be tested among the bits of the read data and by electrically disconnecting output paths of bits not to be tested among the bits of the read data in response to a plurality of switch control signals in a test mode to expand a valid data window of an output data, wherein the output circuit comprises:

a first switching circuit configured to selectively output the bits of the read data in response to a first switch control signal and a second switch control signal;

a first selecting circuit configured to selectively latch bits of an output of the first switching circuit to generate first selection data;

a second switching circuit configured to selectively output bits of the first selection data in response to a third switch control signal and a fourth switch control signal; and a second selecting circuit configured to selectively latch bits of an output of the second switching circuit to generate second selection data.

2. The semiconductor memory device of claim 1, wherein the switch control signals are generated based on test mode register set signals applied from outside.

3. The semiconductor memory device of claim 1, wherein the first to fourth switch control signals are enabled in the normal mode.

4. The semiconductor memory device of claim 3, wherein the test mode comprises:

a first test mode in which a first bit and a third bit of the read data are outputted as first output data; and a second test mode in which a second bit and a fourth bit of the read data are outputted as second output data.

5. The semiconductor memory device of claim 4, wherein a first bit of the first output data corresponds to the first bit of the read data, a second bit of the first output data corresponds to the third bit of the read data, a first bit of the second output data corresponds to the second bit of the read data, and a second bit of the second output data corresponds to the fourth bit of the read data.

6. The semiconductor memory device of claim 5, wherein the first bit of the first output data is generated at a rising edge of a first pulse of the clock signal and maintained for one period of the clock signal, and the second bit of the first output data is generated at a rising edge of a second pulse of the clock signal and maintained for one period of the clock signal.

7. The semiconductor memory device of claim 5, wherein the first bit of the second output data is generated at a falling edge of a first pulse of the clock signal and maintained for one period of the clock signal, and the second bit of the second output data is generated at a falling edge of a second pulse of the clock signal and maintained for one period of the clock signal.

8. The semiconductor memory device of claim 5, wherein the first switch control signal, the third switch control signal and the fourth switch control signal are enabled, and the second switch control signal is disabled in the first test mode, and the second switch control signal, the third switch control signal and the fourth switch control signal are enabled, and the first switch control signal is disabled in the second test mode.

9. The semiconductor memory device of claim 8, wherein a valid output data window in the test mode is about twice wider than a valid output data window in the normal mode.

10. The semiconductor memory device of claim 3, wherein the test mode comprises:

a first test mode in which a first bit of the read data is outputted as first output data;

a second test mode in which a third bit of the read data is outputted as second output data;

a third test mode in which a second bit of the read data is outputted as third output data; and a fourth test mode in which a fourth bit of the read data is outputted as fourth output data.

11. The semiconductor memory device of claim 10, wherein the first output data corresponds to the first bit of the read data; the second output data corresponds to the third bit of the read data; the third output data corresponds to the second bit of the read data; and the fourth output data corresponds to the fourth bit of the read data.

12. The semiconductor memory device of claim 11, wherein the first output data is generated at a rising edge of a first pulse of the clock signal and maintained for two periods of the clock signal; the second output data is generated at a rising edge of a second pulse of the clock signal and maintained for two periods of the clock signal; the third output data is generated at a falling edge of a first pulse of the clock signal and maintained for two periods of the clock signal; and the fourth output data is generated at a falling edge of a second pulse of the clock signal and maintained for two periods of the clock signal.

13. The semiconductor memory device of claim 10, wherein the first switch control signal and the third switch control signal are enabled, and the second switch control signal and the fourth switch control signal are disabled in the first test mode; the first switch control signal and the fourth switch control signal are enabled, and the second switch control signal and the third switch control signal are disabled in the second test mode; the second switch control signal and the third switch control signal are enabled, and the first switch control signal and the fourth switch control signal are disabled in the third test mode; and the second switch control signal and the fourth switch control signal are enabled, and the first switch control signal and the third switch control signal are disabled in the fourth test mode.

14. The semiconductor memory device of claim 13, wherein a valid output data window in the test mode is about four times wider than a valid output data window in the normal mode.

15. The semiconductor memory device of claim 4, wherein the first switching circuit comprises:

a first switch configured to output the first bit of the read data in response to the first switch control signal;

a second switch configured to output the third bit of the read data in response to the second switch control signal;

a third switch configured to output the second bit of the read data in response to the first switch control signal; and a fourth switch configured to output the fourth bit of the read data in response to the second switch control signal.

16. The semiconductor memory device of claim 4, wherein the first selecting circuit comprises:

a first multiplexer configured to selectively output one of the first bit and the third bit of the read data in response to the clock signal; and a second multiplexer configured to selectively output one of the second bit and the fourth bit of the read data in response to the clock signal.

17. The semiconductor memory device of claim 4, wherein the second switching circuit comprises:

a first switch configured to output a first bit of the first selection data in response to the third switch control signal; and a second switch configured to output a second bit of the first selection data in response to the fourth switch control signal.

18. The semiconductor memory device of claim 4, wherein the second selecting circuit comprises a multiplexer configured to selectively output one of a first bit and a second bit of output data of the second switching circuit.

19. The semiconductor memory device of claim 4, wherein the first switching circuit comprises:
   a first switch configured to output the first bit of the read data in response to the first switch control signal;
   a second switch configured to output the third bit of the read data in response to the second switch control signal;
   a third switch configured to output the second bit of the read data in response to the first switch control signal;
   a fourth switch configured to output the fourth bit of the read data in response to the second switch control signal;
   a fifth switch configured to output the first bit of the read data in response to the first switch control signal;
   a sixth switch configured to output the third bit of the read data in response to the second switch control signal;
   a seventh switch configured to output the second bit of the read data in response to the first switch control signal; and
   an eighth switch configured to output the fourth bit of the read data in response to the second switch control signal.

20. The semiconductor memory device of claim 4, wherein the first selecting circuit comprises:
   a first multiplexer configured to selectively output one of the first bit and the third bit of the read data in response to the clock signal;
   a second multiplexer configured to selectively output one of the second bit and the fourth bit of the read data in response to the clock signal;
   a third multiplexer configured to selectively output one of the first bit and the third bit of the read data in response to the clock signal; and
   a fourth multiplexer configured to selectively output one of the second bit and the fourth bit of the read data in response to the clock signal.

21. The semiconductor memory device of claim 4, wherein the second switching circuit comprises:
   a first switch configured to output a first bit of the first selection data in response to the third switch control signal;
   a second switch configured to output a second bit of the first selection data in response to the fourth switch control signal;
   a third switch configured to output the first bit of the first selection data in response to the third switch control signal; and
   a fourth switch configured to output the second bit of the first selection data in response to the fourth switch control signal.

22. The semiconductor memory device of claim 4, wherein the second selecting circuit comprises:
   a first multiplexer configured to selectively output one of a first bit and a second bit of output data of the second switching circuit; and
   a second multiplexer configured to selectively output one of the first bit and the second bit of the output data of the second switching circuit.

23. The semiconductor memory device of claim 4 further comprising an output driving circuit configured to buffer the second selection data to generate the output data.

24. An output circuit of a semiconductor memory device, comprising:
   a first switching circuit configured to selectively output bits of read data in response to a first switch control signal and a second switch control signal;
   a first selecting circuit configured to selectively latch bits of an output of the first switching circuit to generate first selection data;
   a second switching circuit configured to selectively output bits of the first selection data in response to a third switch control signal and a fourth switch control signal; and
   a second selecting circuit configured to selectively latch bits of an output of the second switching circuit to generate second selection data.

25. The output circuit of a semiconductor memory device of claim 24 further comprising an output driving circuit configured to buffer the second selection data to generate output data.

* * * * *